(12) United States Patent
Ellis-Monaghan et al.

(10) Patent No.: US 10,141,472 B2
(45) Date of Patent: *Nov. 27, 2018

(54) PHOTODIODE STRUCTURES

(71) Applicant: INTERNATIONAL BUSINESS MACHINES CORPORATION, Armonk, NY (US)

(72) Inventors: John J. Ellis-Monaghan, Grand Isle, VT (US); Jeffrey P. Gambino, Portland, OR (US); Mark D. Jaffe, Shelburne, VT (US); Kirk D. Peterson, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/408,004

(22) Filed: Jan. 17, 2017

(65) Prior Publication Data

US 2017/0125626 A1    May 4, 2017

Related U.S. Application Data

(63) Continuation of application No. 14/483,584, filed on Sep. 11, 2014, now Pat. No. 9,627,575.

(51) Int. Cl.
*H01L 31/0232* (2014.01)
*H01L 31/18* (2006.01)
(Continued)

(52) U.S. Cl.
CPC .......... *H01L 31/1808* (2013.01); *G02B 6/12* (2013.01); *G02B 6/12004* (2013.01);
(Continued)

(58) Field of Classification Search
CPC . G02B 6/12; G02B 6/12004; H01L 31/02327; H01L 31/028; H01L 31/103;
(Continued)

(56) References Cited

U.S. PATENT DOCUMENTS 4,995,049 A *    2/1991    Kahen .................... H01L 27/15
                                                                 257/513
5,238,877 A      8/1993    Russell
(Continued)

FOREIGN PATENT DOCUMENTS

WO       2015120583 A1    8/2015

OTHER PUBLICATIONS

Jagar et al., "Single Grain Thin-Film-Transistor (TFT) with SOI CMOS Performance Formed by Metal-Induced-Lateral-Crystallization", IEEE, IEDM 99, 1999, pp. 293-296.
(Continued)

*Primary Examiner* — Shaun Campbell
(74) *Attorney, Agent, or Firm* — Steven Meyers; Andrew M. Calderon; Roberts Mlotkowski Safran Cole & Calderon, P.C.

(57) ABSTRACT

Photodiode structures and methods of manufacture are disclosed. The method includes forming a waveguide structure in a dielectric layer. The method further includes forming a Ge material in proximity to the waveguide structure in a back end of the line (BEOL) metal layer. The method further includes crystallizing the Ge material into a crystalline Ge structure by a low temperature annealing process with a metal layer in contact with the Ge material.

15 Claims, 4 Drawing Sheets

(51) Int. Cl.
  *H01L 31/103* (2006.01)
  *H01L 31/028* (2006.01)
  *G02B 6/12* (2006.01)
  *H01P 1/17* (2006.01)
  *H01L 31/02* (2006.01)
  *H01P 3/16* (2006.01)

(52) U.S. Cl.
  CPC ...... *H01L 31/028* (2013.01); *H01L 31/02327* (2013.01); *H01L 31/103* (2013.01); *H01L 31/1864* (2013.01); *H01L 31/1872* (2013.01); *H01L 31/02005* (2013.01); *H01L 2223/6627* (2013.01); *H01P 1/172* (2013.01); *H01P 3/16* (2013.01); *Y02E 10/50* (2013.01)

(58) Field of Classification Search
  CPC ............. H01L 31/1808; H01L 31/1864; H01L 31/1872; H01L 31/02005; H01L 2223/6627; H01P 1/172; H01P 3/16
  USPC .............................................. 438/69; 257/432
  See application file for complete search history.

(56) References Cited

U.S. PATENT DOCUMENTS

| | | | |
|---|---|---|---|
| 5,855,993 | A | 1/1999 | Brady et al. |
| 6,324,204 | B1* | 11/2001 | Deacon .............. G02B 6/12007 372/20 |
| 6,727,517 | B2 | 4/2004 | Chan et al. |
| 6,855,988 | B2 | 2/2005 | Madurawe |
| 7,259,106 | B2 | 8/2007 | Jain |
| 7,501,331 | B2 | 3/2009 | Herner |
| 7,616,904 | B1* | 11/2009 | Gunn, III .............. H01L 31/109 257/431 |
| 7,656,001 | B2 | 2/2010 | Bui et al. |
| 8,258,050 | B2 | 9/2012 | Cho et al. |
| 8,349,635 | B1 | 1/2013 | Gan et al. |
| 8,536,043 | B2 | 9/2013 | Kim et al. |
| 8,884,384 | B2 | 11/2014 | Yamaguchi et al. |
| 9,627,575 | B2* | 4/2017 | Ellis-Monaghan ................. H01L 31/1808 |
| 2005/0026423 | A1 | 2/2005 | Yamazaki |
| 2008/0253728 | A1 | 10/2008 | Sparacin et al. |
| 2009/0108384 | A1* | 4/2009 | Assefa ............... G02B 6/12004 257/432 |
| 2009/0252938 | A1 | 10/2009 | Baik et al. |
| 2011/0012221 | A1 | 1/2011 | Fujikata et al. |
| 2011/0084308 | A1 | 4/2011 | Loh et al. |
| 2012/0129302 | A1 | 5/2012 | Assefa et al. |
| 2012/0288971 | A1* | 11/2012 | Bogaerts ............ G02B 6/12004 438/24 |
| 2013/0175697 | A1 | 7/2013 | Nguyen et al. |
| 2013/0285059 | A1 | 10/2013 | Yamaguchi et al. |
| 2014/0054736 | A1 | 2/2014 | Meade et al. |
| 2014/0212087 | A1* | 7/2014 | Cho ....................... G02B 6/136 385/14 |
| 2014/0307997 | A1* | 10/2014 | Bar ..................... H01L 21/8258 385/14 |
| 2014/0339702 | A1 | 11/2014 | Woychik et al. |
| 2016/0027950 | A1 | 1/2016 | Liu et al. |
| 2016/0079451 | A1 | 3/2016 | Ellis-Monaghan et al. |
| 2017/0125627 | A1 | 5/2017 | Ellis-Monaghan et al. |

OTHER PUBLICATIONS

Phung et al., "Low Temperature Metal Induced Lateral Crystallization of Ge Using Germanide Forming Metals", Journal of the Electrochemical Society, vol. 157, No. 2, 2010, pp. H208-H213.

Nagata et al., "Grain Filtering in MILC and Its Impact on Performance of n- and p-channel TFTs", IEEE Region 10 Conference, TENCON, 2010, pp. 951-956.

Specification "Photodiode Structures" and Drawings in related U.S. Appl. No. 15/408,012, filed Jan. 17, 2017, 22 pages.

Specification and Drawings "Photodiode Structures" for U.S. Appl. No. 15/807,054, filed Nov. 8, 2017, 22 pages.

Office Action in the Related U.S. Appl. No. 15/408,012 dated Oct. 5, 2017, 12 pages.

Li et al. "Low temperature growth of high crystallinity GeSn on amorphous layers for advanced optoelectronics", Optical materials express, Sep. 1, 2013, vol. 3, No. 9, pp. 1385-1396.

Application and Drawings in related U.S. Appl. No. 15/981,191, titled "Photodiode Structures", filed May 16, 2018, 22 pages.

Application and Drawings in related U.S. Appl. No. 15/971,240, titled "Photodiode Structures", filed May 1, 2018, 22 pages.

Final Office Action dated Feb. 27, 2018 in related U.S. Appl. No. 15/408,012, 15 pages.

Notice of Allowance dated Apr. 11, 2018 in related U.S. Appl. No. 15/408,012, 8 pages.

Krishna C. Saraswat "3-D ICs: Motivation, performance analysis, technology and applications" 2010 17th IEEE International Symposium on the Physical and Failure Analysis of Integrated Circuits, 29, Jul. 2010, pp. 1-6 (Year: 2010).

Office Action in related U.S. Appl. No. 15/807,054 dated Sep. 6, 2018, 18 pages.

Specification "Photodiode Structures" and Drawings in related U.S. Appl. No. 16/136,488, filed Sep. 20, 2018, 23 pages.

List of IBM Patents or Patent Applications Treated as Related 1 page.

* cited by examiner

PHOTODIODE STRUCTURES

FIELD OF THE INVENTION

The invention relates to semiconductor structures and, more particularly, to photodiode structures and methods of manufacture.

BACKGROUND

A photodiode is a semiconductor device that converts light into current. In use, the current is generated when photons are absorbed in the photodiode. Photodiodes may contain optical filters, built-in lenses, and may have large or small surface areas depending on the application.

The material used to make a photodiode is critical to defining its properties. This is mainly because only photons with sufficient energy to excite electrons across the material's bandgap will produce significant photocurrents. Some materials used in photodiodes include metal wiring, silicon and germanium.

Crystalline germanium can be used as an optical detector; however if germanium is deposited in an amorphous form and it is not in contact with crystalline silicon it will require a long anneal at 450° C. to 550° C. in order to crystallize. This high temperature will result in many grain boundaries. Also, such high temperatures can destroy metal lines in the photodiode during the fabrication processes.

SUMMARY

In an aspect of the invention, a method comprises forming a waveguide structure in a dielectric layer. The method further comprises forming a Ge material in proximity to the waveguide structure in a back end of the line (BEOL) metal layer. The method further comprises crystallizing the Ge material into a crystalline Ge structure in the dielectric material by a low temperature annealing process with a metal layer in contact with the Ge material.

In an aspect of the invention, a method comprises forming a waveguide structure in a dielectric material. The method further comprises forming a Ge material in proximity to the waveguide structure. The method further comprises forming at least one via in the dielectric material to expose a surface of the Ge material. The method further comprises forming a metal seed layer on sidewalls of the at least one via and in contact with the surface of the Ge material. The method further comprises crystallizing the Ge material by a low temperature annealing process with the metal seed layer in contact with the Ge material through a nucleation process.

In an aspect of the invention, a structure comprises: a waveguide structure and metal wiring layers in a dielectric material; a crystalline Ge structure formed in proximity to the waveguide structure in the dielectric material; and at least one metal filled via in electrical contact with the Ge material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
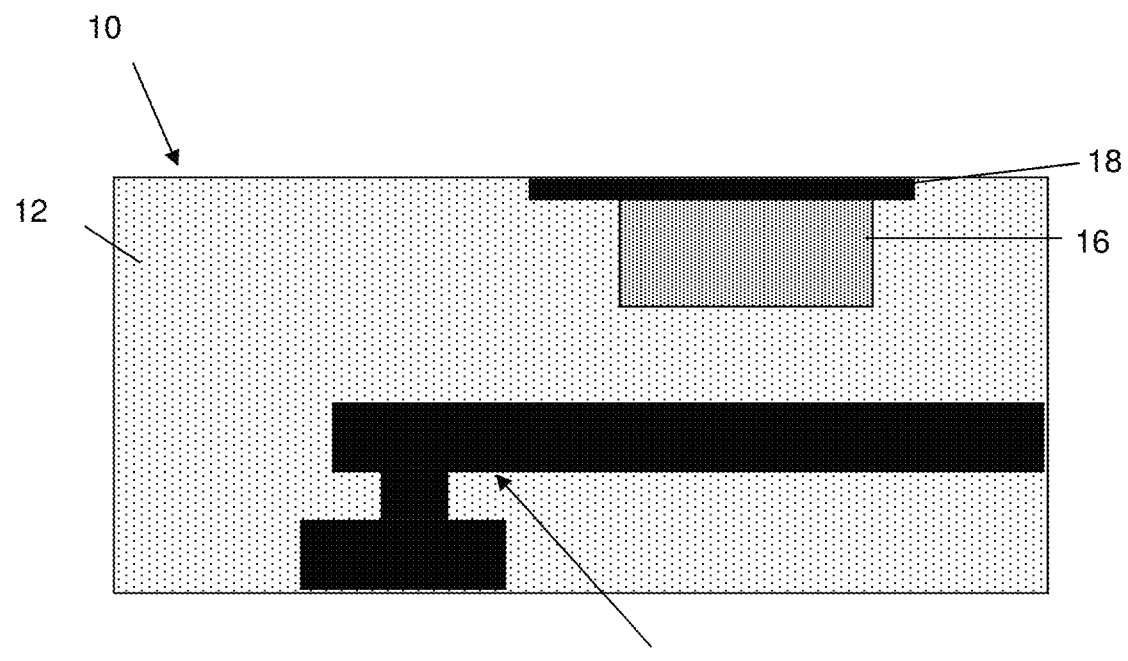
FIGS. 1-5 show respective structures and fabrication processes according to an aspect of the present invention.

The invention relates to semiconductor structures and, more particularly, to photodiode structures and methods of manufacture. In more specific embodiments, the photodiode structures are metal induced lateral crystallized germanium (Ge) photodiodes. Advantageously, the metal induced lateral crystallized germanium (Ge) photodiodes will have improved electrical and optical performance.

In embodiments, the crystallization of the photodiode can be, for example, provided by annealing a metal contact on germanium material of the photodiode using a low temperature anneal, e.g., 350° C. to 420° C. The low temperature anneal can be part of a standard metal contact process and structure, e.g., back end of the line (BEOL) processes. The metal contact can be a Ni contact to Ge to lower the anneal crystallization temperature. That is, Ni (or another metal as described herein) will act as a nucleation site for Ge, which will have the effect of lowering the overall thermal budget (a function of temperature and time) to crystallize the Ge and result in larger grains.

It should be noted that if the Ge is not in contact with the metal to act as this nucleation site (catalyst) such as Ni, it would take a hotter temperature upwards of 450° C. to 550° C. to crystallize the Ge, which would also create smaller crystal grains. Accordingly, by implementing the processes of the present invention, the Ge will form into a recrystallized structure with large single crystal regions (e.g., lateral crystallized germanium structure) in a dielectric material, and not a smaller polycrystalline structure which has degraded electrical and optical performance.

In embodiments, the region of Ge material can have several crystallized regions each large, e.g., larger than a few microns in length. This is obtained by using the seed window, e.g., Ni contact to Ge (without the seed window polycrystalline Ge will form, with 10×poorer dark current.) The large grain size will reduce the number of crystallized regions, thereby reducing the total amount of grain boundaries. This, in turn, will improve optical performance by reducing light scattering and improving dark current.

In further embodiments, other metals are contemplated by the present invention for the seed window including, for example, all forms of germanides, e.g., Co, Pd, etc., or all forms of eutectics, e.g., Au, Ag, Al, etc. The structures of the present invention can be used in BEOL metal stack, as well as in a package or on a board, for example.

More specifically, the optical detector, e.g., waveguide structure and Ge material (photo detector structure), is formed in the dielectric material of the wiring layers of a printed circuit board, package or the wiring levels of a semiconductor chip. In any of these embodiments, the Ge material is provided in the dielectric layer of any particular wiring level at a BEOL; instead of being in contact with a single crystalline silicon material in a front end of the line (FEOL) process, as in conventional structures. In each of these applications of the present invention, the photo detector (e.g., germanium) will be deposited in an amorphous deposition process in a BEOL wiring layer, followed by a low temperature anneal (nucleation process) to be crystallized for best opto/electrical properties.

The photodiode structures of the present invention can be manufactured in a number of ways using a number of different tools. In general, though, the methodologies and tools are used to form structures with dimensions in the micrometer and nanometer scale. The methodologies, i.e., technologies, employed to manufacture the level translator of the present invention have been adopted from integrated circuit (IC) technology. For example, the structures of the present invention are built on wafers and are realized in films of material patterned by photolithographic processes on the top of a wafer. In particular, the fabrication of the level translator of the present invention uses basic building blocks, including: (i) deposition of thin films of material on a substrate, (ii) applying a patterned mask on top of the films by photolithographic imaging, and (iii) etching the films selectively to the mask.

FIGS. 1-5 show respective structures and fabrication processes according to aspects of the present invention. More specifically, in FIG. 1, the structure 10 includes a substrate 12, e.g., interlevel dielectric layers such as an oxide. The structure 10 further includes wiring and contact layers generally depicted at reference numeral 14. The wiring and contact layers 14 can be fabricated using conventional CMOS processes, e.g., deposition, lithography and etching (reactive ion etching (RIE)) during back end of line (BEOL) processes. For example, the wiring and contact layers 14 can be formed using conventional subtractive or additive processes.

Illustratively and by way of brief explanation, at appropriate wiring levels of the dielectric layer 12, a metal can be deposited (e.g., using chemical vapor deposition (CVD), plasma enhanced CVD (PECVD) or other appropriate deposition methods) on a surface of the dielectric layer 12 and a photoresist can be formed thereon. The photoresist can be exposed to energy (e.g., light) in order to form a pattern. Through conventional etching processes, e.g., reactive ion etching (RIE) with appropriate chemistries, a corresponding pattern (vias) is formed in the wiring and contact layers 14. This can be used to form contacts and wiring, etc. above a silicon layer and FEOL structures, depending on the pattern, design and level of the structure. The photoresist is then removed using conventional processes, e.g., oxygen ashing processes. An oxide or other insulator material is then deposited about the wiring and contact layers 14 to form additional interlevel dielectric layers 12.

In an additive process, a dielectric layer will be patterned and etched to form an area for both wires and vias, and a metal, e.g., copper, tungsten, etc., deposited within the pattern to form the wiring and contact layers 14. Any residual material is removed from the surface of the dielectric material using, e.g., a chemical mechanical process (CMP).

Still referring to FIG. 1, a waveguide structure 16 is formed on a surface of the dielectric layer 12. In embodiments, the waveguide structure 16 can be a silicon material or nitride material, depending on the particular application of the device and other design criteria. In embodiments, the waveguide structure 16 can be formed by conventional deposition, lithography and etching (reactive ion etching (RIE)) process, as already described herein. The waveguide structure 16 can be planarized using conventional CMP processes. In the case of the waveguide being silicon, a barrier layer 18, e.g., $Si_3N_4$, can be deposited and patterned on the waveguide structure 16 using conventional CMOS processes.

Figure 2:
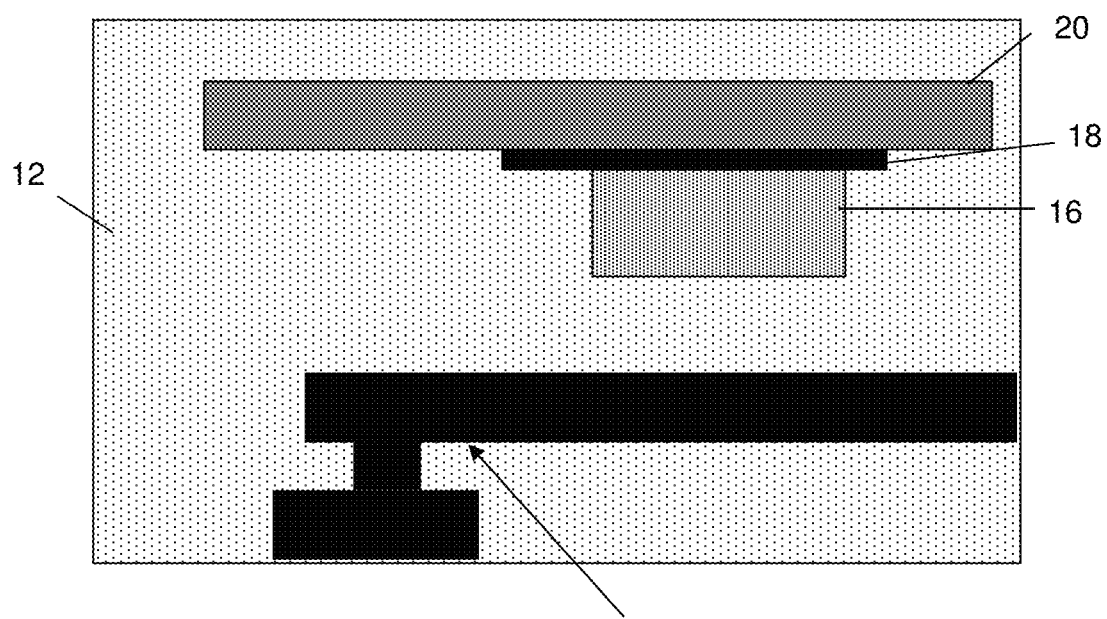

In FIG. 2, a layer of Ge material (photo detector) 20 is deposited over the waveguide structure 16, in an amorphous state. In embodiments, the Ge material 20 can also be formed below the waveguide structure or in proximity thereto as already shown in FIG. 2. In preferred embodiments, the layer of Ge material 20 is amorphous Ge formed in the dielectric layer 12, as compared to a conventional photodiode where the Ge material is formed in direct contact with the single crystalline substrate in order to crystallize the Ge material. In this case, because the Ge is in contact with crystalline silicon, the anneal temperature to recrystallize Ge is low and there are not yet metal lines that cannot tolerate the recrystallization anneal. The layer of Ge material 20 can be formed using conventional deposition, e.g., CVD, and patterning processes. The layer of Ge material 20 is patterned (e.g., using lithography and etching processes) to form the structure shown in FIG. 2. In embodiments, the layer of Ge material 20 can be offset from a center with the waveguide structure 16; although, other positions and locations as described herein are also contemplated by the present invention. Additional dielectric layers 12 can then be deposited over the layer of Ge material 20 and planarized using a CMP process.

Figure 3:
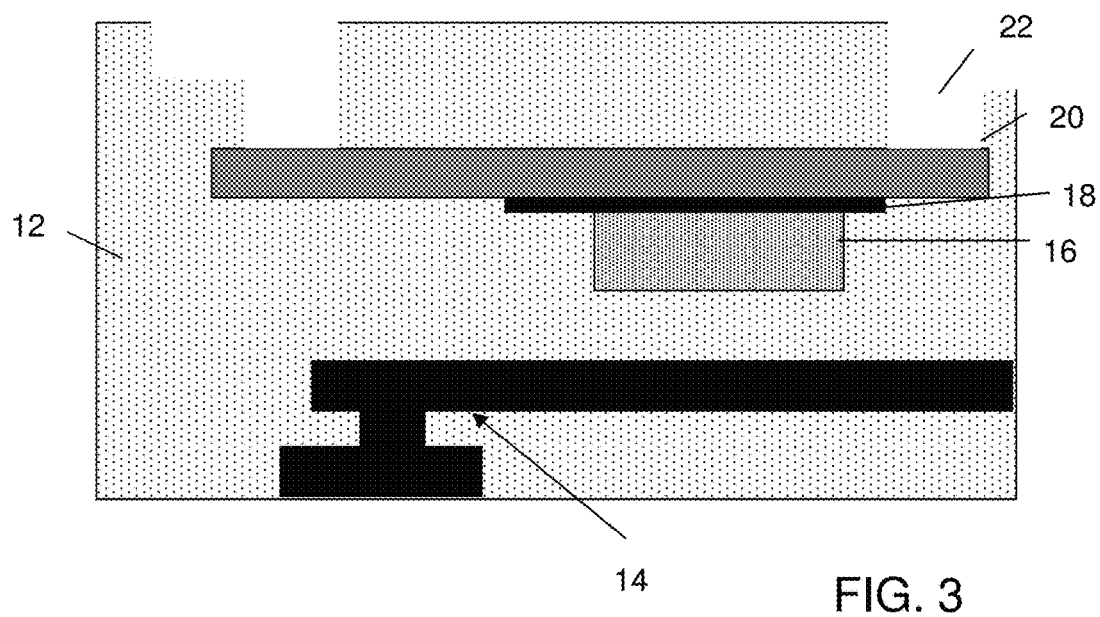

In FIG. 3, a dual damascene process is performed to form vias and trenches 22. In embodiments, two single damascene processes can also be performed in order to form the vias and trenches 22. The trenches expose the layer of Ge material 20. In preferred embodiments, the vias and trenches 22 are positioned to not interfere with light entering the waveguide structure 16. In addition, in embodiments, the vias and trenches 22 are positioned such that a halfway point between them is not over the waveguide structure 16. Accordingly, as noted already, the layer of Ge material 20 can be offset with respect to the waveguide structure 16, e.g., not centered on the waveguide structure 16.

Figure 4:
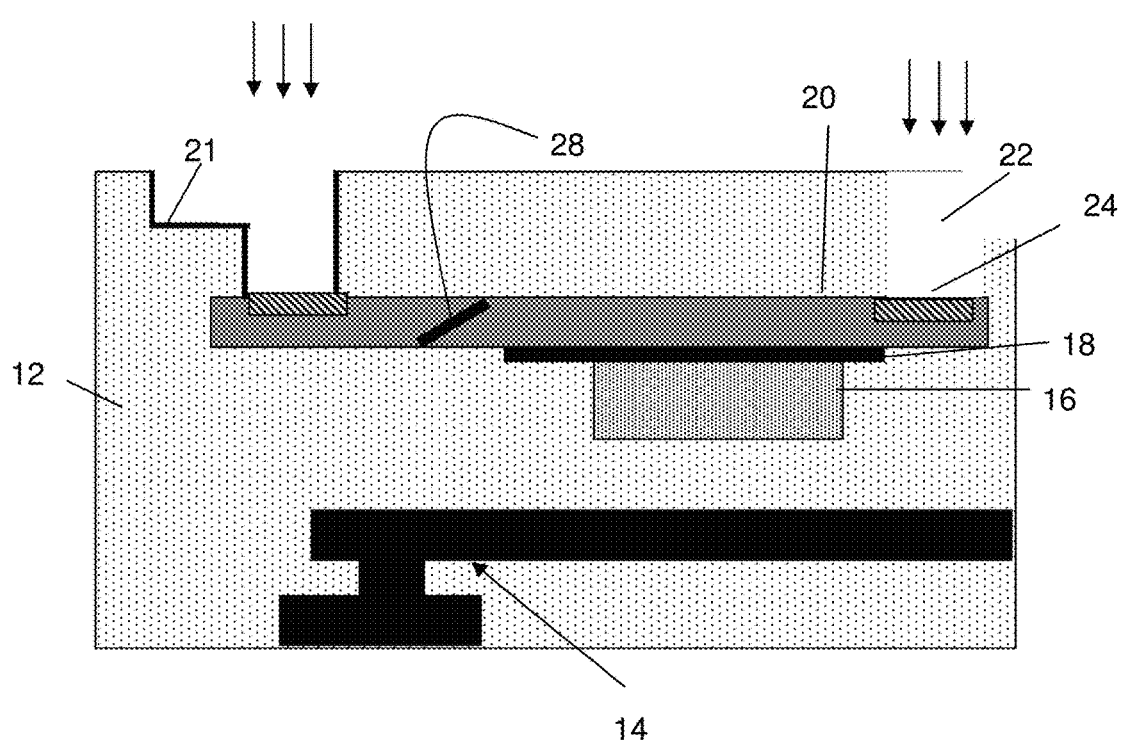

As representatively shown in FIG. 4, a metal seed layer 21, e.g., nickel (Ni), is deposited within the vias and trenches 22. More specifically, the seed layer 21 is formed on sidewalls of the at least one via and trench structures and in contact with a surface of the Ge material 20. It should be understood that FIG. 4 representatively shows the seed layer 21 only in a single via and trench for ease of explanation; however, in this embodiment, the seed layer 21 is deposited in both (or all) of the vias and trenches 22. In embodiments, the metal seed layer 21 will provide nucleation of the layer of Ge material 20 and lower its temperature for lateral crystallization processes. The metal seed layer 21 is not limited to Ni, and can be, for example, all forms of germanides, e.g., Co, Pd, etc., or all forms of eutectics, e.g., Au, Ag, Al, etc.

Still referring to FIG. 4, the structure then undergoes a low temperature annealing process at about 350° C. to 420° C. in order to result in a heat reaction between the Ge and the seed layer, thereby beginning a nucleation process to form a crystalline Ge structure. In embodiments, the nucleation begins at the metal layer, e.g., nickel, forming a capping layer 24 as a result of the nucleation process. As should be understood by those of skill in the art, nucleation can occur in two stages. In the first nucleation stage, a small nucleus containing the newly forming crystal is created at the initial site, e.g., at the interface of the Ge amorphous material and the metal seed layer. After crystal nucleation, the second stage of growth rapidly ensues, where the crystal growth spreads outwards from the nucleating site such that the Ge material will be in a crystalline form as nucleation continues away from the initial site. In this way, the Ge material will be crystallized relative to the waveguide structure 16.

In this example, the nucleation site, e.g., capping layer 24, can be a compound of NiGe, using Ni as the seed layer. Also, as described above, the Ni (or other metal) will act as a nucleation site for Ge, effectively of lowering the overall thermal budget (a function of temperature and time) to crystallize the Ge and result in larger grains. For example, the nucleation process will crystallize the Ge layer 20 at a lower temperature, e.g., about 350° C. to 420° C., without the need to be in contact with a single crystalline silicon in a FEOL structure. This low temperature process thus allows the crystalline Ge material to form in the BEOL metal layer, which improves its electrical and optical characteristics while not damaging any of the metal lines. In addition, this process provides flexibility in forming the crystalline Ge material in any metal layer, compared to being restrained by forming the photo detector in contact with a silicon at a higher temperature process in the FEOL processes.

In embodiments, the crystallized Ge layer 20 can undergo a volume change during the heating process; however, such volume change, e.g., expansion, can be accommodated by the additional space provided by the vias and trenches 22. In this way, the integrity of the crystallized Ge layer 20 will remain intact, e.g., the crystallized Ge layer 20 will not crack the encapsulating dielectric.

In embodiments, a boundary layer 28 can also form in the crystallized Ge layer 20; however, this boundary layer is not provided over the waveguide structure 16 due to the positioning of, e.g., the crystallized Ge layer 20 and/or vias and trenches 22. Also, any remaining unreacted metal in the vias and trenches 22 can be cleaned using an etch process, for example as shown representatively in the rightmost via and trench of FIG. 4. Although FIG. 4 shows the metal seed layer 21 in the leftmost via and trench, this is provided merely for explanation of the deposition of the seed layer and one of skill in the art would understand that this metal seed layer 21 is also removed during subsequent processes, as described herein. Also, in optional embodiments, the capping layer 24 can be removed. In this optional embodiment, metal which subsequently fills the via and trenches will be in direct physical and electrical contact with the crystallized Ge layer.

Figure 5:
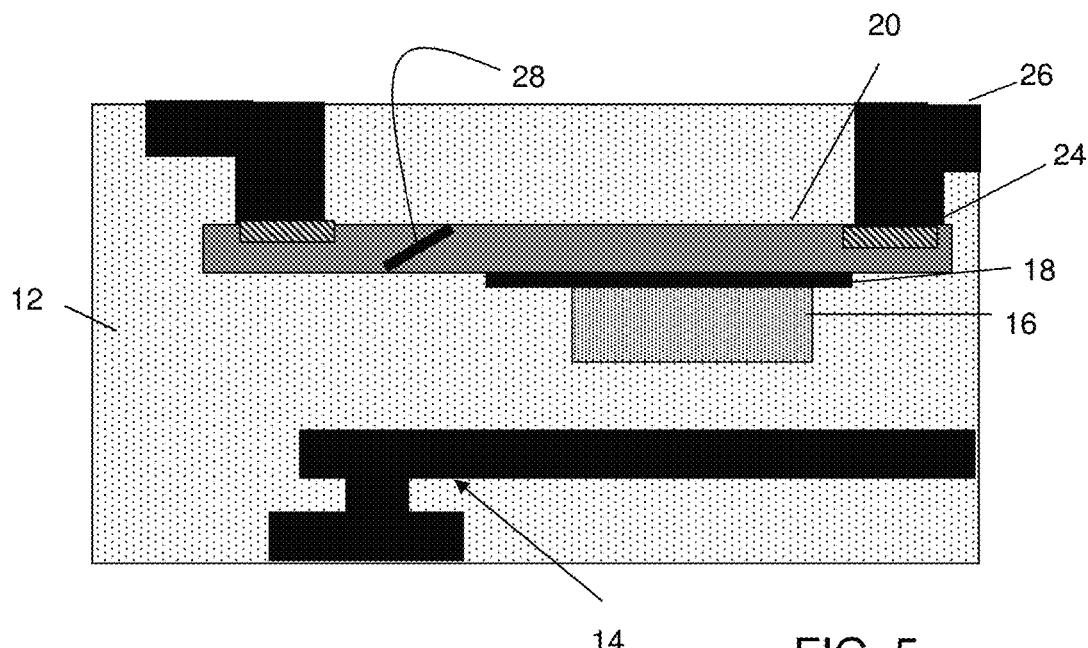

As shown in FIG. 5, the vias and trenches are filled with metal material 26, in contact with the crystallized Ge layer 20. By way of example, the vias and trenches can be lined with metals such as: Ta, TaN, or Ti, then filled with copper or other metal. The copper can then be planarized using a CMP process, to result in the structure shown in FIG. 5. Although not part of the present invention, additional processes can continue including packaging etc.

Figure 6:
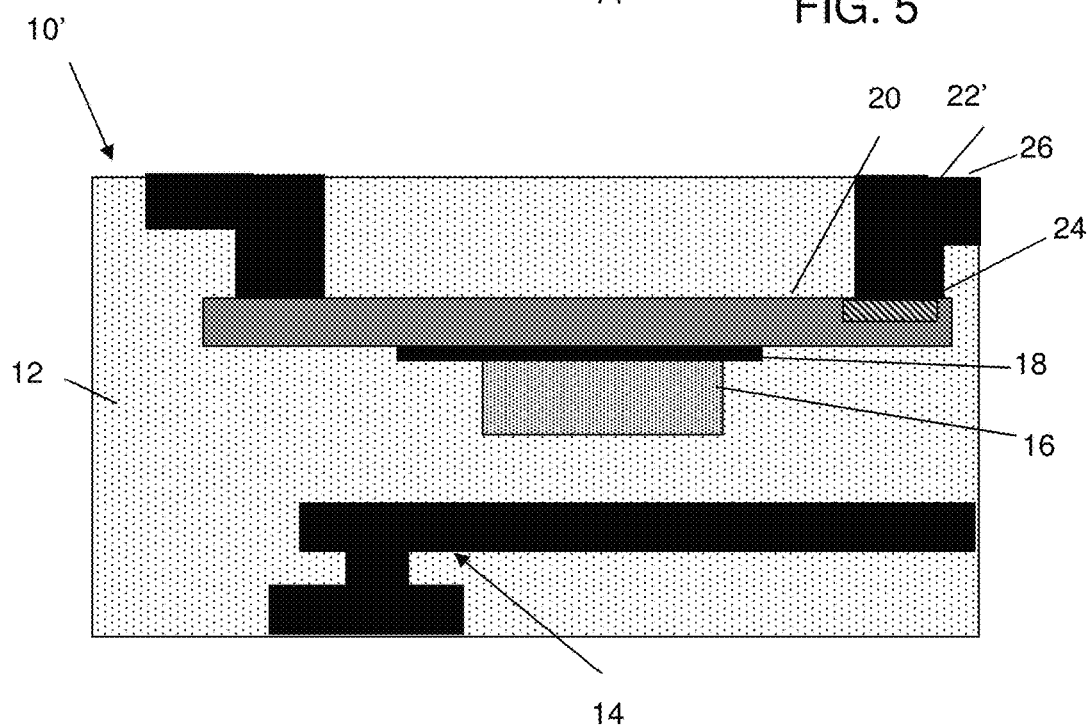
FIG. 6 shows a structure and respective fabrication processes according to additional aspects of the present invention.

FIG. 6 shows a structure 10' and respective fabrication processes according to additional aspects of the present invention. In particular, in this embodiment, the metal seed layer, e.g., nickel (Ni), is deposited in only one of the vias and trenches 22' to form a capping layer 24. In embodiments, the metal seed layer will provide nucleation of the layer of Ge material 20 as described above, in order to crystallize the layer of Ge material 20 at low temperatures. Again, the metal seed layer is not limited to Ni, and can be, for example, all forms of germanides, e.g., Co, Pd, etc., or all forms of eutectics, e.g., Au, Ag, Al, etc.

Still referring to FIG. 6, to crystallize the Ge material (e.g., form a recrystallized structure with large single crystal regions on the order of a few microns in length) and to form the capping layer 24, the structure undergoes an annealing process at about 350° C. to 420° C. This process crystallizes the Ge layer 20 at a lower temperature, e.g., about 350° C. to 420° C., which improves its electrical and optical characteristics while not damaging any of the metal lines. Also, since the seed layer is provided in only a single via and trench structure, this process may eliminate the boundary layer, hence, the waveguide structure 16 can be positioned at other locations with respect to the crystallized Ge layer 20 and/or the via and trench 22'. Also, any remaining unreacted metal in the via and trench 22' can be cleaned using an etch process, for example, with the option of removing the capping layer 24. The vias and trenches can be filled with metal material 26, in contact with the crystallized Ge layer 20, as already described herein. Although not part of the present invention, additional process can continue including packaging, etc.

Figure 7:
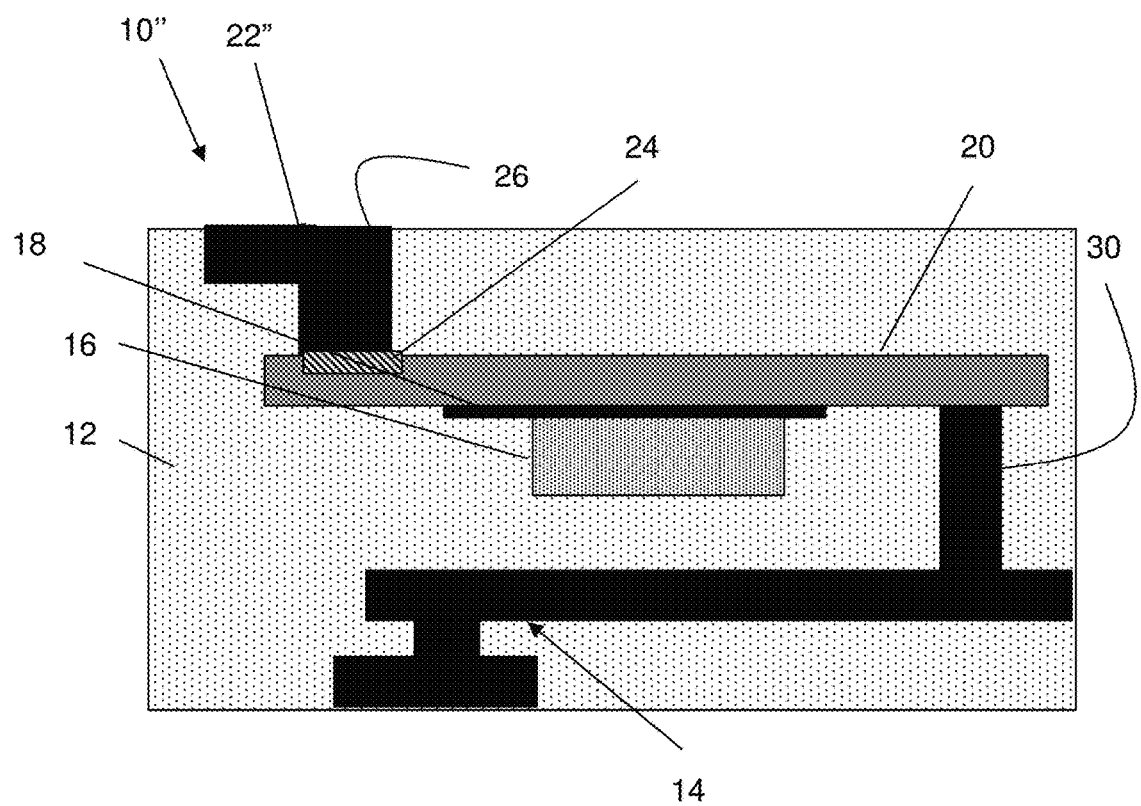
FIG. 7 shows a structure and respective fabrication processes according to additional aspects of the present invention.

In FIG. 7, the structure 10" includes a single via and trench structure 22", which includes the recrystallized Ge material with large single crystal regions (e.g., lateral crystallized germanium structure) and capping layer 24 formed by heat reaction as described with regard to FIGS. 1-6, e.g., annealing process at about 350° C. to 420° C. in order to result in a heat reaction between the Ge and the seed layer. That is, a metal seed layer, e.g., nickel (Ni), is deposited in the via and trench 22", formed remotely from the waveguide structure 16. In embodiments, the metal seed layer will provide nucleation of the layer of Ge material 20 as described above, which assists in the crystallizing of the Ge material at the low temperature. Again, the metal seed layer is not limited to Ni, and can be, for example, all forms of germanides, e.g., Co, Pd, etc., or all forms of eutectics, e.g., Au, Ag, Al, etc. A metal interconnect 30, e.g., tungsten, can also connect an underlying metal layer 14 to the crystallized Ge layer 20. The metal interconnect 30 can be formed using conventional CMOS processes as described herein.

In embodiments, the structure 10" of FIG. 7 may eliminate the boundary layer, hence, the waveguide structure 16 can be positioned at other locations with respect to the crystallized Ge layer 20 (e.g., crystalline Ge structure) and/or via and trench 22". Also, any remaining unreacted metal in the via and trench 22" can be cleaned using a wet etch process, for example, with the option of removing the capping layer 24. The vias and trenches can be filled with metal material 26, in contact with the crystallized Ge layer 20, as already described herein. Although not part of the present invention, additional process can continue including packaging, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a waveguide structure in a dielectric layer;
   forming an amorphous Ge material over an upper surface of the waveguide structure in a back end of the line (BEOL) metal layer; and
   crystallizing the amorphous Ge material into a crystalline Ge structure by an annealing process with a metal layer in contact with the Ge material,
   wherein the forming of the Ge material adjacent to the waveguide structure in a back end of the line (BEOL) metal layer comprises:
      depositing a barrier layer of nitride directly on the upper surface of the waveguide structure, followed by a patterning of the barrier layer;
      depositing the amorphous Ge material directly on the barrier layer, followed by a patterning of the amorphous Ge material;
      opening a via to expose portions of the amorphous Ge material;
      depositing the metal layer on the amorphous Ge material through the opening of the via; and
      crystallizing of the amorphous Ge material through the annealing process to form the crystalline Ge structure aligned with the via.

2. The method of claim 1, wherein the annealing process is at about 350° C. to 420° C.

3. The method claim 2, wherein the metal layer is a metal seed layer formed in direct contact with the Ge material within the via formed to expose a surface of the amorphous Ge material, the annealing process is performed after deposition of the metal seed layer is formed in direct contact with the Ge material, within the via of the dielectric layer.

4. The method of claim 1, wherein the metal layer is a metal seed layer of Ni in contact with the Ge material.

5. The method of claim 1, wherein the metal layer is a germanide or a eutectic.

6. The method of claim 1, wherein any unreacted metal layer is removed after the annealing process.

7. The method of claim 1, wherein the metal layer is a metal seed layer deposited in a via and on a surface of the Ge material.

8. The method of claim 1, wherein the metal layer is a metal seed layer deposited in two vias in a dielectric material composing BEOL wiring layers, offset from a center of the Ge material.

9. The method of claim 1, wherein the metal layer is a metal seed layer deposited in one of at least two vias.

10. The method of claim 1, wherein the crystallizing of the amorphous Ge material comprises:
    forming at least one via in a dielectric material to expose the amorphous Ge material;
    forming a metal seed layer in the at least one via;
    annealing the metal seed layer at a temperature of about 350° C. to 420° C. to form a capping layer on the amorphous Ge material and to laterally crystallize the amorphous Ge material; and
    removing any unreacted metal seed layer.

11. The method claim 10, further comprising filling the via with metal, in contact with the amorphous Ge material.

12. The method of claim 11, further comprising removing the capping layer such that the metal in the via is in direct contact with the metal.

13. The method of claim 1, wherein the crystallizing the amorphous Ge material into the crystalline Ge structure comprises:
    depositing the metal layer as a metal seed layer directly on the amorphous Ge material which has been exposed by etching a trench and the via in the dielectric layer; and
    laterally crystallizing the amorphous Ge material by the annealing process between 350° C. and 420° C.

14. The method of claim 13, wherein the metal seed layer is formed on sidewalls of the trench and via that exposes a surface of the amorphous Ge material prior to the deposition of the metal seed layer.

15. The method of claim 14, further comprising forming a boundary layer in the crystallized Ge material, which is positioned to a side of the waveguide structure.

* * * * *